United States Patent
Sato

(10) Patent No.: US 8,558,280 B2
(45) Date of Patent: Oct. 15, 2013

(54) SEMICONDUCTOR DEVICE AND METHOD OF MANUFACTURING THE SEMICONDUCTOR DEVICE

(75) Inventor: Ken Sato, Saitama (JP)

(73) Assignee: Sanken Electric Co., Ltd., Saitama-Ken (JP)

( * ) Notice: Subject to any disclaimer, the term of this patent is extended or adjusted under 35 U.S.C. 154(b) by 211 days.

(21) Appl. No.: 13/030,450

(22) Filed: Feb. 18, 2011

(65) Prior Publication Data

US 2011/0204417 A1    Aug. 25, 2011

(30) Foreign Application Priority Data

Feb. 22, 2010  (JP) ................. P.2010-035949

(51) Int. Cl.
*H01L 29/66*   (2006.01)
*H01L 21/02*   (2006.01)

(52) U.S. Cl.
USPC .......... 257/190; 257/192; 257/E29.091; 438/460; 438/462

(58) Field of Classification Search
USPC ............ 257/190, 192, 194, E29.091
See application file for complete search history.

(56) References Cited

U.S. PATENT DOCUMENTS

2005/0145851 A1*  7/2005  Johnson et al. .......... 257/76

FOREIGN PATENT DOCUMENTS

JP    2009272492 A    11/2009

* cited by examiner

*Primary Examiner* — Matthew W Such
*Assistant Examiner* — Scott Stowe
(74) *Attorney, Agent, or Firm* — Wilmer Cutler Pickering Hale and Dorr LLP

(57) ABSTRACT

A semiconductor device according to the present invention including: a substrate; a compound semiconductor layer formed on the substrate; an element forming area provided in the compound semiconductor layer; and at least one semiconductor element, which includes a first main electrode and a main second electrode, wherein the at least one semiconductor element is formed in the element forming area, wherein the compound semiconductor layer includes: a first compound growth layer, which is formed on the substrate and includes the element forming area; and a second compound growth layer formed on the substrate to surround the element forming area when viewed from a plane, wherein the second compound growth layer has a crystallinity lower than a crystallinity of the first compound growth layer.

14 Claims, 6 Drawing Sheets

SEMICONDUCTOR DEVICE AND METHOD OF MANUFACTURING THE SEMICONDUCTOR DEVICE

CROSS-REFERENCE TO RELATED APPLICATION

This application claims priority from Japanese Patent Application No. 2010-035949 filed on Feb. 22, 2010, the entire subject matter of which is incorporated herein by reference.

BACKGROUND

1. Technical Field

The present invention relates to a semiconductor device and a method of manufacturing the same, and specifically to a semiconductor device in which a plurality of element forming areas and dicing areas are formed on a semiconductor substrate, and a method of manufacturing the same.

2. Background

A related art (for example, JP-A-2009-272492) discloses a semiconductor device, which has superior high-frequency characteristics and small leakage current, made of a silicon (Si) substrate and a compound semiconductor layer and a method of manufacturing the same. The compound semiconductor layer in a related semiconductor element is made of gallium nitride (GaN), aluminum gallium nitride (AlGaN), etc. In the related art, in case where the semiconductor wafer is divided along a dicing line, two trenches are first formed so that the compound semiconductor may be divided into a plurality of element forming areas. Next, the compound semiconductor layer and a substrate are diced along a dicing area, which is provided between two trenches. As a result, a semiconductor wafer is divided into separate semiconductor devices.

According to a related art, the compound semiconductor element is prevented from being damaged or cracked during the dicing process, thereby preventing decrease in yield of a semiconductor device.

SUMMARY

However, the two trenches in the related art are formed in its depth direction from a surface of the compound semiconductor layer to reach an inner side of the silicon substrate. Accordingly, the trench have to be formed very deep (see paragraph [0028]), thereby requiring an anisotropic etching processing for a long time period and increasing cost in manufacturing a semiconductor device.

Accordingly, the present invention has been made in consideration of the above, and the present invention is to provide a semiconductor device and a semiconductor wafer capable of preventing a decrease in yield of a semiconductor device in a dicing process.

With considering the above, a semiconductor device according to the present invention including: a substrate; a compound semiconductor layer formed on the substrate; an element forming area provided in the compound semiconductor layer; and at least one semiconductor element, which includes a first main electrode and a second main electrode, wherein the at least one semiconductor element is formed in the element forming area, wherein the compound semiconductor layer includes: a first compound growth layer, which is formed on the substrate and includes the element forming area; and a second compound growth layer formed on the substrate to surround the element forming area when viewed from a plane, wherein the second compound growth layer has a crystallinity lower than a crystallinity of the first compound growth layer.

Further, with considering the above, a method of manufacturing a semiconductor device, which includes: a substrate; a compound semiconductor layer formed on the substrate; an element forming area provided in the compound semiconductor layer; and at least one semiconductor element, which includes a first main electrode and a second main electrode, wherein the at least one semiconductor element is formed in the element forming area, including: selectively forming a low crystalline film on the substrate; forming a first compound growth layer, which includes the element forming area on the substrate; and forming a second compound growth layer on the low crystalline film to surround the element forming area when viewed from a plane, wherein the second compound growth layer has a crystallinity lower than a crystallinity of the first compound growth layer; and forming at least one semiconductor element in the element forming area.

According to the semiconductor device and the method of manufacturing the semiconductor device in the present invention, the semiconductor device, which can prevent decreasing in yield of the semiconductor device in a dicing process, can be provided at low cost.

DESCRIPTION OF PREFERRED ILLUSTRATIVE ASPECTS

Figure 1A:
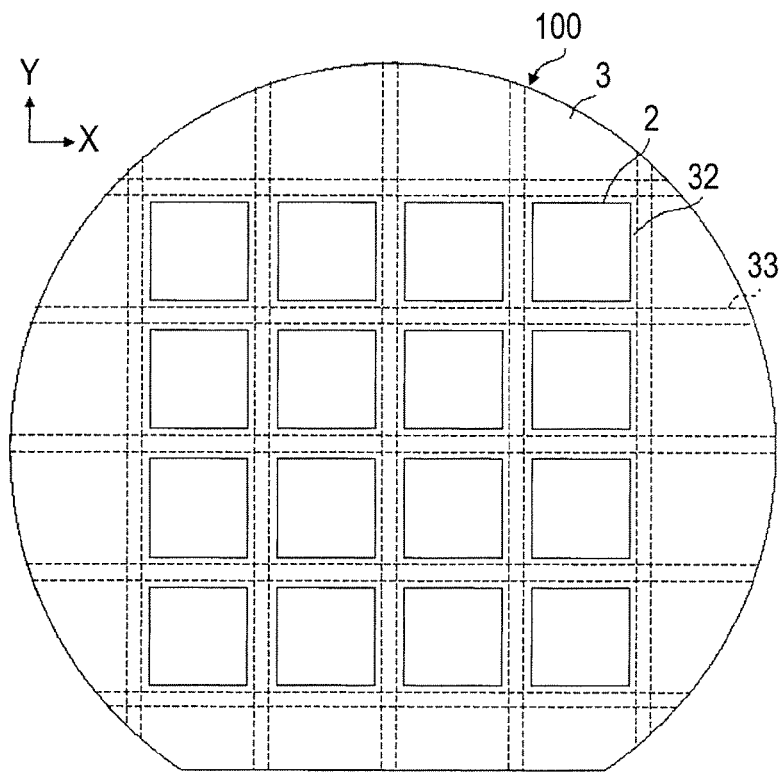
FIG. 1A is a plan view showing a semiconductor wafer according to a first illustrative aspect of the present invention.

Hereinafter, illustrative aspects of the present invention will be described with reference to the drawings. In the figures, same or like reference numbers refer to the same or equivalent parts of the present invention throughout the several figures of the drawing. The drawings are schematic and may not exactly actual products. Further, the dimensions or ratios of the parts may not represent actual products and may vary in different drawings accompanied herein.

(First Illustrative Aspect)

Figure 1B:
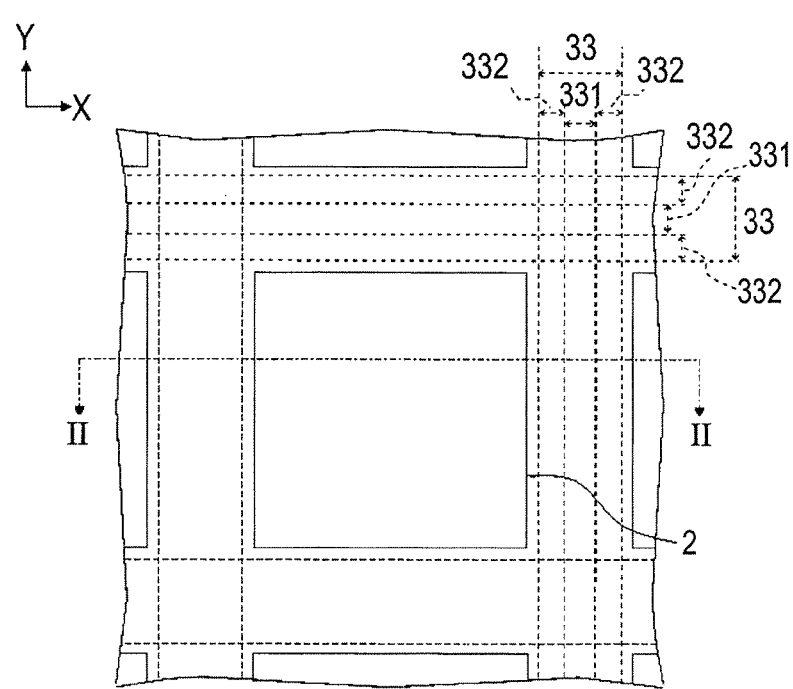
FIG. 1B is a partly enlarged view.
Figure 2:
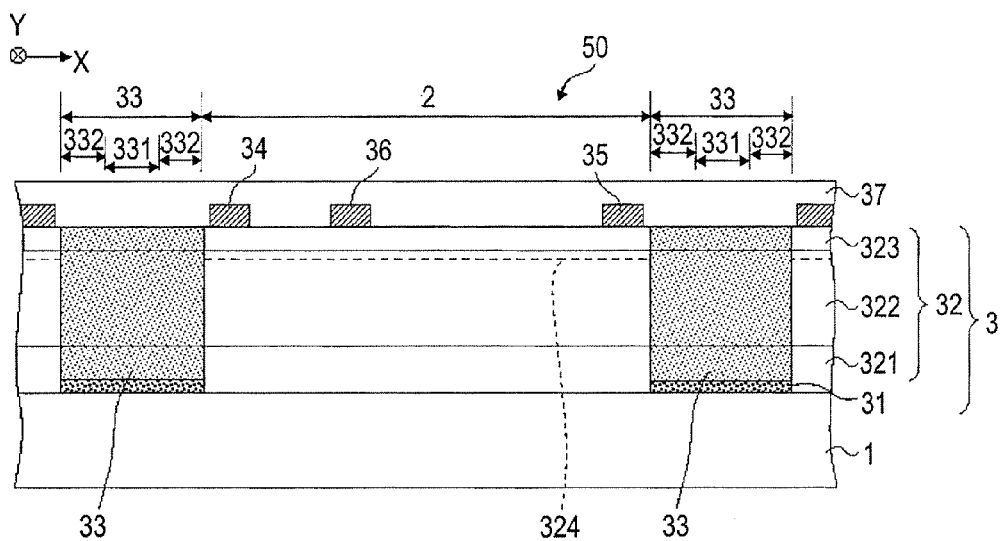
FIG. 2 is a cross sectional view showing a semiconductor wafer taken along a line II-II shown in FIG. 1B.

FIG. 1A is a plan view showing a semiconductor wafer 100 according to a first illustrative aspect of the present invention. FIG. 1B is a partly enlarged view showing a semiconductor wafer 100. FIG. 2 is a cross sectional view showing a semiconductor wafer 100 taken along a line II-II shown in FIG. 1B.

(Configuration of Semiconductor Device)

The semiconductor wafer 100 according to the present invention includes a substrate 1, a compound semiconductor layer 3 having a plurality of element forming areas 2, a low crystalline film 31, a first compound growth layer 32 and a second compound growth layer 33.

Also, the semiconductor device 50 according to the present invention includes a substrate 1, a compound semiconductor layer 3 having an element forming area 2, a low crystalline film 31, a first compound growth layer 32, a first main electrode 34, and a second main electrode 35.

The substrate 1 is a single crystal substrate made of silicon (Si), silicon carbide (SiC), gallium nitride (GaN), or sapphire, etc. In the illustrative aspect, the substrate 1 is made of silicon single crystal.

The element forming area 2 is an area that is included in the first compound growth layer 32 of the compound semiconductor layer 3, and, at the same time, that is surrounded by the second compound growth layer 33. The element forming area 2 is also referred to as an active area, and a semiconductor element, such as a Field Effect Transistor (FET), or a Schottky Barrier Diode (SBD), etc., is formed in the element forming area 2.

The compound semiconductor layer 3 is formed on the substrate 1 and has the element forming area 2. Further, the compound semiconductor layer 3 includes a low crystalline film 31, a first compound growth layer 32, and a second compound growth layer 33.

The low crystalline film 31 is selectively formed on the substrate 1. The low crystalline film 31 is arranged between the substrate 1 and the second compound growth layer 33. Thus, the low crystalline film 31 may be referred to as an under layer for forming the second compound growth layer 33. The low crystalline film 31 is a non-crystal (amorphous) or polycrystalline film and made of a material, which is capable of chemically-combining with the second compound growth layer 33, such as a metal nitride, for example, aluminum nitride (AlN), titanium nitride (TiN), etc. Preferably, the material applied to the low crystalline film 31 is a high melting-point material, of which crystallinity is not easy to return even though it is exposed to a high temperature in a growth process of the compound semiconductor layer 3. Meanwhile, such material as silicon oxide (SiO2), which causes the first compound growth layer 32 to selectively-grow or Epitaxial-Lateral-Overgrown (ELO), or silicon (Si), which has a low melting point, may not be applied to a material of the low crystalline film 31. In this illustrative aspect of the present invention, the low crystalline film 31 is made of an amorphous AlN.

The first compound growth layer 32 is formed on the substrate 1 and has the element forming area 2. Further, the first compound growth layer 32 includes a buffer layer 321, a carrier transit layer 322, a carrier supply layer 323, and 2-dimensional carrier gas layer 324. That is, a semiconductor element, in which the 2-dimensional carrier gas layer 324 is used as a channel is formed, in the element forming area 2.

The buffer layer 321 is formed to buffer both a lattice mismatching occurred between the substrate 1 and the carrier transit layer 322 and a stress caused by the lattice mismatching. The buffer layer 321 is formed on the substrate 1 and has, for instance, a stack structure in which a GaN layer and an AlN layer are alternately stacked. Incidentally, the buffer layer 321 may be omitted because it does not directly serve to an operation of the semiconductor element. The carrier transit layer 322 and the carrier supply layer 323 are formed to generate the 2-dimensional carrier gas layer 324 adjacent to the interface of their hetero-junction. The carrier transit layer 322 is made of, for instance, non-doped GaN. Herein, the term "non-doped" means a state that impurities are not introduced intentionally. The carrier supply layer 323 has a larger band gap than the carrier transit layer 322 and also has a smaller lattice constant than the carrier transit layer 322. The carrier supply layer 323 is made of, for instance, non-doped $Al_xGa_{1-x}N$ (aluminum gallium nitride). Herein, the symbol "x" is a number in the range of 0.2 to 0.4, and the x is 0.26 in this illustrative aspect. Also, a GaN layer may be formed on the carrier supply layer 323 as a cap layer.

According to this illustrative aspect of the present invention, the first and second main electrodes 34 and 35 may be used as a source electrode 34 and a drain electrode 35, respectively, and the first and second main electrodes 34 and 35 may be disposed apart from each other on the carrier supply layer 323 and formed to ohmic-contact the 2-dimensional carrier gas layer 324. Alternatively, the source electrode 34 and the drain electrode 35 may be formed on the carrier transit layer 322. A gate electrode 36 controls a carrier concentration in the 2-dimensional carrier gas layer 324. The gate electrode 36 is formed between the source electrode 34 and the drain electrode 35 on the carrier supply layer 323. A protection film 37 is formed on each of the electrodes and the compound semiconductor layer 3, and thus the semiconductor element the protection film 37 from its exterior. That is, in this illustrative aspect, the semiconductor element formed in the element forming area 2 is a High Electron Mobility Transistor (HEMT) in which the 2-dimensional electron gas (the 2-dimensional carrier gas layer 324) is used as a channel. Also, in the semiconductor device 50 according to this aspect, one semiconductor element is formed in each element forming area 2, but a plurality and/or different kind of semiconductor elements may be formed in each element forming area 2.

The second compound growth layer 33 is formed on the low crystalline film 31, when viewed from a cross section. Further, the second compound growth layer 33 is made of a semiconductor material having a crystallinity lower than that of the semiconductor material forming the first compound growth layer 32. According to this illustrative aspect of the present invention, the second compound growth layer 33 is extended linearly in an X direction and Y direction in the figures and is formed to surround the element forming area 2, when viewed from a plane. The second compound growth layer 33 is made of, for instance, amorphous or polycrystalline GaN and AlGaN so as to include the semiconductor material forming the first compound growth layer 32. Alternatively, the second compound growth layer 33 may be formed to include a larger number of crystal defects than the first compound growth layer 32. In this illustrative aspect of the present invention, the second compound growth layer 33 may be described as a single semiconductor layer, for the sake of convenience in the explanation. In detail, it may be understood that the second compound growth layer 33 has the same stack structure as that of the first compound growth layer. Also, the second compound growth layer 33 has a first area 331 and a second area 332. The first area 331 is an area provided at the center of the second compound growth layer 33. The first area 331 is used as a dicing area, when the semiconductor wafer 100 is divided into a plurality of semiconductor device 50, and cut away to remove by a dicing blade. Accordingly, the width of the first area 331 is wider than that of the dicing blade, for instance, formed in the about 20 to 60 μm. The second area 332 is an area provided between the element forming area 2 and the first area 331.

(Manufacturing Method of Semiconductor Device)

FIGS. 3A to 3H are procedural cross sectional views illustrating a method of manufacturing semiconductor wafer and a method of manufacturing a semiconductor device according to the first illustrative aspect of the present invention.

The manufacturing method of the semiconductor wafer according to the present invention includes a first process for forming a low crystalline film 31 on a substrate 1, and a second process for forming a first compound growth layer 32 and a second compound growth layer 33.

Also, the manufacturing method of the semiconductor device includes a first process for forming a low crystalline film 31 on a substrate 1, a second process for forming a first compound growth layer 32 and a second compound growth layer 33, and a third process for a semiconductor element on an element forming area 2.

Figure 3A:
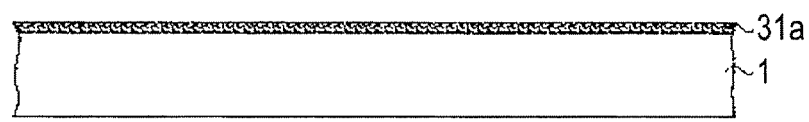
FIGS. 3A to 3H are procedural cross sectional views illustrating a method of manufacturing semiconductor wafer and a method of manufacturing a semiconductor device according to the first illustrative aspect of the present invention.

First, as shown in FIG. 3A, as argon (Ar) and nitrogen ($N_2$) are supplied onto the surface of the substrate 1 that is made of, for instance, a single crystal silicon, a reactive sputtering method is performed by using a Al target, thereby forming a low crystal material film 33a that is made of a non-crystalline (amorphous) AlN, on the substrate 1. The low crystal material film 31a may be formed by the sputtering method targeted at AlN. In general, the low crystal material film is formed easier than a single crystal material film. Alternatively, the well known Metal Organic Chemical Vapor Deposition (MOCVD) may be applied as the other method. The temperature of the substrate 1 is maintained in the degree of 400 to 600° C., and Trimethyl Aluminium (TMA), Trimethyl Gallium (TMG) and Ammonia ($NH_3$) are properly supplied onto the substrate 1, thereby forming the low crystal material film 31a. The low crystal material film 31a is formed in a thickness of, for instance, about 10 to 200 nm.

Figure 3B:
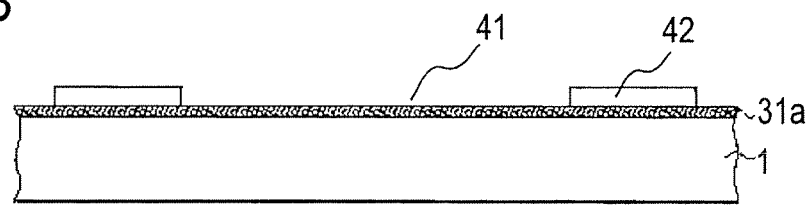

Next, as shown in FIG. 3B, a mask 42 made of $SiO_2$ is formed on the low crystal material film 31a. The mask 42 is formed by mean of well-known photolithography and etching method to have a predetermined opening 41. For example, a photoresist layer (not shown) having a pattern for forming the opening 41 on the $SiO_2$ film is formed, anisotropic etching such as Reactive Ion Etching (RIE) by gas including fluorine (F) is performed on the photoresist layer, thereafter, the photoresist is removed. The mask 42 is formed at an area, where the low crystalline film 31 to be formed, on the low crystal material film 31a, and the low crystal material film 31a is exposed at other area than said area.

Figure 3C:

Next, as shown in FIG. 3C, the low crystalline film 31 is formed on the substrate 1. The low crystal film 31 is formed by performing an anisotropic etching such as RIE, etc., on the low crystal material film 31a via the mask 42 and by etching a part of the low crystal material film 31a.

The manufacturing process shown in FIG. 3A, FIG. 3B, and FIG. 3C is referred to as a first process according to the present invention.

Figure 3D:
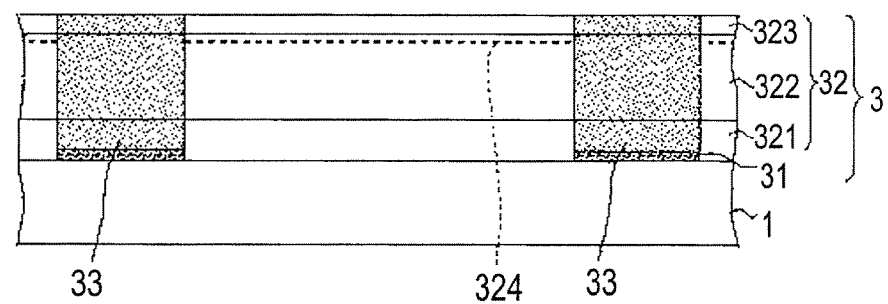

Next, as shown in FIG. 3D, the compound semiconductor layer 3 is formed on the substrate 1. That is, the first compound growth layer 32, which includes the buffer layer 321, carrier transit layer 322 and carrier supply layer 323, is formed on the substrate 1, and the second compound growth layer 33 is formed on the low crystalline film 31. The first compound growth layer 32 and the second compound growth layer 33 are formed, while the substrate 1 formed the low crystalline film 31 is placed within a chamber of MOCVD apparatus and TMA, TMG (trimethyl gallium) and $NH_3$ are properly supplied into the chamber. In this illustrative aspect, the thickness of the buffer layer 321 is about 2 µm, and the carrier supply layer 323 is formed in a thickness of about 25 nm. The 2-dimensional carrier gas layer 324 is generated within the carrier transit layer 322. In this process, since the first compound growth layer 32 is grown with taking over the crystallinity of single crystal silicon forming the substrate 1, the carrier transit layer 322 and carrier supply layer 323 specifically have a relatively low crystal defect and a relatively superior crystallinity. Also, the second compound growth layer 33 is grown with taking over the crystallinity of amorphous AlN forming the low crystalline film 31, thereby having a crystallinity lower than the first compound growth layer 32.

The manufacturing process as shown in FIG. 3D is referred to as a second process. Also, in case where the first compound growth layer 32 and the second compound growth layer 33 have a uneven surface due to a result of performing the second process, the second process may include a planarization process such as a Chemical Mechanical Polishing (CMP) process or an etch back process.

Figure 3E:
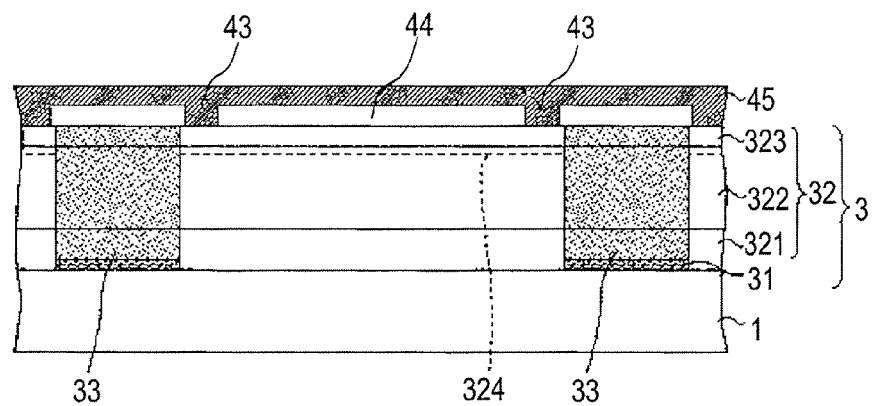

Next, as shown in FIG. 3E, a mask 44 having an open 43 is formed on the compound semiconductor layer 3, and then, a metal film 45 is formed. The mask 44 and the opening 43 are formed in the same manner as the mask 42 and the opening 41 as described in the above. The opening 43 is formed at an area where the source electrode 34 and the drain electrode 35 are to be formed. A sputtering method targeting at titanium (Ti) and aluminum (Al) is performed on the mask 44. As a result the metal film 45 having a stack structure of Ti layer and Al layer is formed. The metal film 45 other than the source electrode 34 and the drain electrode 35 is removed by a lift-off method.

Figure 3F:
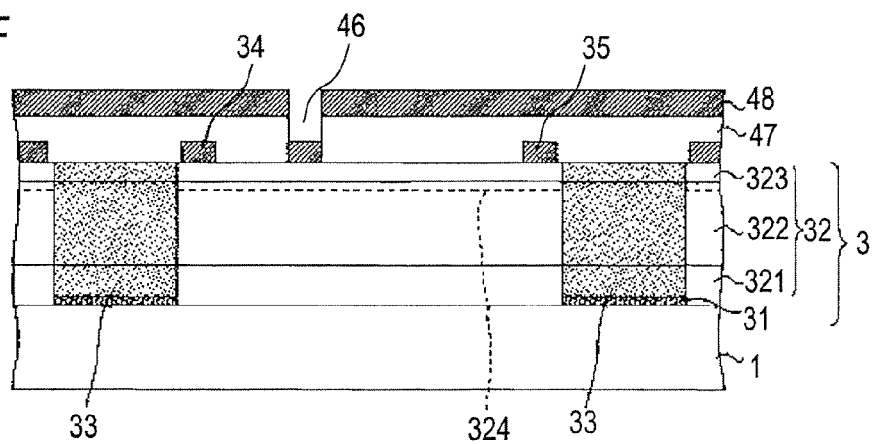

Next, as shown in FIG. 3F, a mask 47 having a predetermined opening 46 is formed on the compound semiconductor layer 3, and the metal film 48 is formed thereon. The mask 47 and the opening 46 are formed in the same manner as the mask 42 and the opening 41 described in the above. The opening 46 is formed at an area where the gate electrode is to be formed. The sputtering method targeting at nickel (Ni) and gold (Au) is performed on the mask 47. As a result, the metal film 45 having a stack structure of Ni layer and Au layer is formed. The metal film 45 other than the gate electrode 36 is removed by the lift-off method.

Figure 3G:
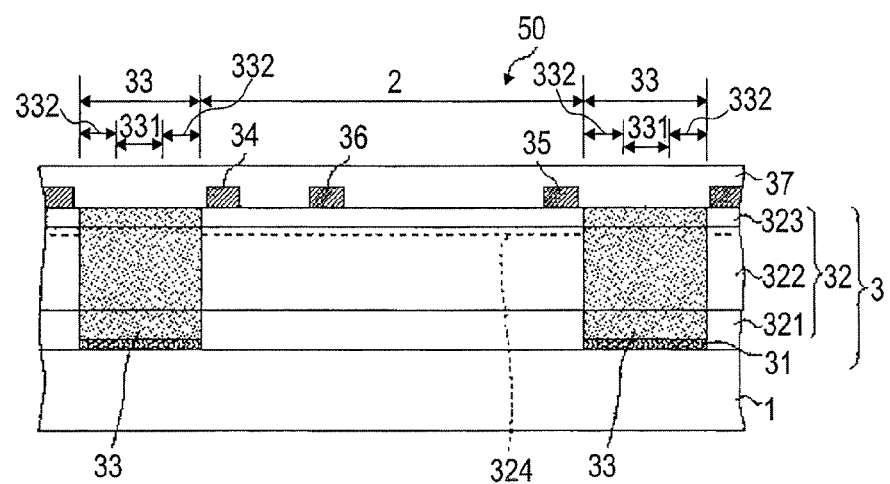

Next, as shown in FIG. 3G, the protection film 37 is formed on the compound semiconductor layer 3. The protection film 37 is made of, for instance, SiO2, and may be acquired by performing a well-known CVD method on the compound semiconductor layer 3.

The manufacturing process as shown in FIG. 3E, FIG. 3F and FIG. 3G may be referred to as a third process.

Figure 3H:
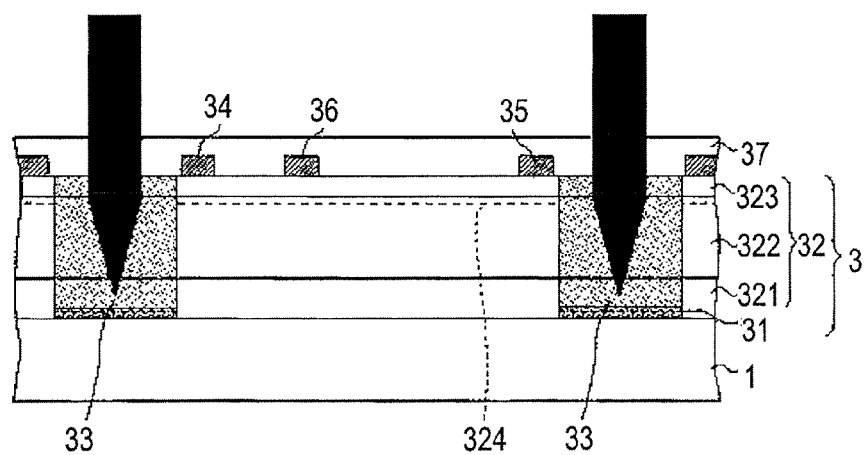

Next, as shown in FIG. 3H, the semiconductor wafer 100 is divided along the first area 331 predetermined as a dicing area in the second compound growth layer 33 and is divided into a plurality of semiconductor elements (semiconductor device 50). A part of the second compound growth layer 33 including the first area 331 and a part of the substrate 1 are cut away from the surface of the compound semiconductor layer 3 to the rear surface thereof by a dicing blade and are removed. In this process, since the second area 332 in the second compound growth layer 33 is not cut, at least a part of the second compound growth layer 33 is remained between the semiconductor element and the cutting plane by the dicing. The manufacturing process shown in FIG. 3H is referred to as a fourth process.

It will be described that the effects in the semiconductor device, semiconductor wafer, manufacturing method of the semiconductor device, and manufacturing method of the semiconductor wafer, as described in the above.

The semiconductor device and semiconductor wafer according to this illustrative aspect includes the low crystalline film 31 and the second compound growth layer 33 made of an amorphous or polycrystalline semiconductor material. Also, a crystallinity of the second compound growth layer 33 is lower than that of the first compound growth layer 32 and weak in the strength of crystal bond. Also, the first area 331 is provided at the center of dicing area.

In the dicing process in which the semiconductor wafer 100 is divided into a plurality of semiconductor elements 50, since the first area 331, of which the physical strength is relatively low, is cut away, a crack and a damage are prevented, compared with the case where the semiconductor layer the crystallinity of which is high material, such as the first compound growth layer 32, is cut way. Further, since the damage by the dicing blade may be reduced, a blade for Si, which is low hardness and low cost, may be used as a dicing blade. Thus, according to the semiconductor device, semiconductor wafer, manufacturing method of the semiconductor device, and manufacturing method of the semiconductor wafer in this illustrative aspect, it can be reasonably provided a semiconductor wafer and a semiconductor device preventing a decrease in the yield of a semiconductor element in a dicing process.

Also, since the second area 332 is formed between the first area 331 and the element forming area 2, the second area 332 serves to buffer the crack and the damage caused during the dicing process. As a result, the damage and crack spreading to the element forming area 2 is buffered and prevented. Thus, it can be preventing a decrease in the yield of the semiconductor device in the dicing process.

In addition, according to the semiconductor device, semiconductor wafer, manufacturing method of the semiconductor device, and manufacturing method of the semiconductor wafer in this illustrative aspect of the present invention, the low crystalline film 31 and the second compound growth layer 33 may be formed in combination with well known manufacturing techniques. Therefore, the dicing area as described in the foregoing may be obtained by a relatively simple method compared with a related method thereby cheaply providing the semiconductor wafer and the semiconductor device preventing a decrease in the yield.

Also, in case where the compound semiconductor layer 3 is formed on the substrate 1, since the compound semiconductor layer 3 is grown in a manner of hetero-epitaxial growth, the semiconductor wafer 100 may be stressed due to a difference in thermal expansion coefficients between the substrate 1 and the compound semiconductor layer 3, and then the crack or the warpage may be caused. However, according to the semiconductor device, semiconductor wafer, manufacturing method of the semiconductor device, and manufacturing method of the semiconductor wafer in this illustrative aspect of the present invention, the second compound growth layer 33 formed around the element forming area 2 serves to buffer the stress and to prevent warpage and crack from being occurred, thereby improving the yield in the semiconductor wafer and the semiconductor device.

In addition, since the second compound growth layer 33 has a low crystallinity and high electric resistance, it functions as an edge area of the semiconductor device 50. That is, when the semiconductor device 50 is operated, it prevents leakage current from flowing through the cut surface of the semiconductor device 50. Also, in case where a plurality and/or different kind of semiconductor elements is formed one element forming area 2, the second compound growth layer 33 may also function as a device isolation area between each of the semiconductor elements. According to the semiconductor device, semiconductor wafer, manufacturing method of the semiconductor device, and manufacturing method of the semiconductor wafer in the illustrative aspect of the present invention, the electric characteristic of the semiconductor device can be improved. Also, even though the second compound growth layer 33 is formed only as a device isolation area between each of the semiconductor elements, the electric characteristics of the semiconductor device may be improved.

(Second Illustrative Aspect)

Figure 4A:
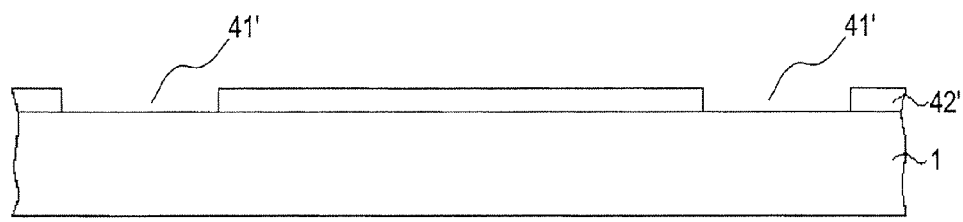
FIGS. 4A to 4C are procedural cross sectional views illustrating a method of manufacturing a semiconductor wafer and a method of manufacturing a semiconductor device according to a second illustrative aspect of the present invention.
Figure 4B:
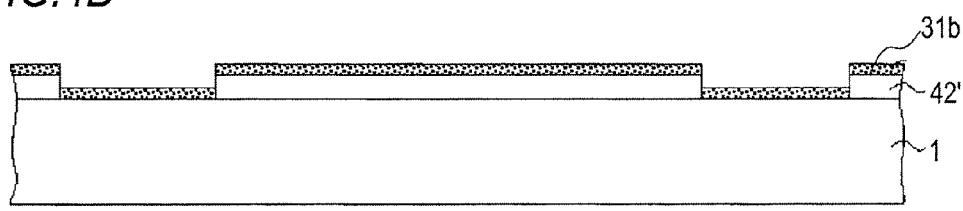
Figure 4C:
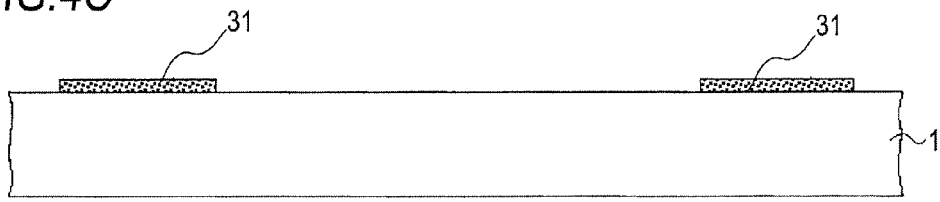

FIGS. 4A to 4C are procedural cross sectional views illustrating a method of manufacturing a semiconductor wafer and a method of manufacturing a semiconductor device according to a second illustrative aspect of the present invention.

The manufacturing of the semiconductor device and the manufacturing method of the semiconductor wafer in the second illustrative aspect of the present invention are different from the manufacturing of the semiconductor device and the manufacturing method of the semiconductor wafer according to the first illustrative aspect in that the lift-off method is used instead of the anisotropic etching method during the first process for forming the low crystalline film 31 on the substrate 1. Other manufacturing method of the second illustrative aspect is the same as in the first illustrative aspect.

First, as shown in FIG. 4A, the mask 42', which has a predetermined opening 41' and is made of $SiO_2$, is formed on the substrate 1 that is made of a single crystal silicon. The mask 42' in the second illustrative aspect is formed by a photolithography method and etching method, similar to the first illustrative aspect using the mask 42 and the opening 41. The mask 42' is formed at one area where the low crystalline film 31 is to be formed on the substrate 1, and the other area on the substrate 1 is exposed.

Next, as shown in FIG. 4B, the low crystal material film 31b is formed on the substrate 1 and the mask 42'. The low crystal material film 31b in this illustrative aspect is formed by the MOCVD or the sputtering method, similar to the low crystal material film 33a in the first illustrative aspect.

Next, as shown in FIG. 4C, the low crystalline film 31 is formed on the substrate 1. The low crystalline film 31 is formed as the low crystal material film 31b formed on the mask 42' is removed (lift-off) together with the mask 42'. The mask 42' is removed by a wet etching method using, for instance, an etching solution of hydrofluoric acid based etchant. The structure shown in FIG. 4C is substantially same to the structure shown in FIG. 3C in the first illustrative aspect. Accordingly, the low crystalline film 31 may be formed by using the lift-off method.

The manufacturing method of the semiconductor device and the manufacturing method of the semiconductor wafer according to the second illustrative aspect can be achieve the same effect as the semiconductor device, the semiconductor wafer, the manufacturing method of the semiconductor device and the manufacturing method of the semiconductor wafer according to the first illustrative aspect of the present invention.

(Illustrative Modification)

The present invention herein has been explained with a few aspects, but is not limited to these specific aspects. The present invention may be changed, or modified, within the scope of the invention. For example, the material forming the low crystalline film 31 is not limited to the material as described in the above, but a material that is non-crystalline (amorphous) or polycrystalline chemically combined with the second compound growth layer 33 may be used. Also, the low crystalline film 31 is not limited to a single layer structure as described in the above, and it may have a multilayer structure. Also, MOS (Metal Oxide Semiconductor) FET, SBD, or, these complex devices may be formed as a semiconductor element other than a HEMT in which a 2-dimensional carrier gas layer is used as a channel.

What is claimed is:
1. A method of manufacturing a semiconductor device, which comprises: a substrate; a compound semiconductor layer formed on the substrate; an element forming area provided in the compound semiconductor layer; and at least one semiconductor element, which includes a first main electrode and a second main electrode, wherein the at least one semiconductor element is formed in the element forming area, the method comprising:

selectively forming a low crystalline film on the substrate;

forming a first compound growth layer, which includes the element forming area on the substrate; and forming a second compound growth layer on the low crystalline film to surround the element forming area when viewed from a plane, wherein the second compound growth layer has a crystallinity lower than a crystallinity of the first compound growth layer; and forming at least one semiconductor element in the element forming area wherein a low crystalline film is selectively formed between the substrate and the second compound growth layer to surround the element forming area when viewed from the plane.

2. The method of manufacturing a semiconductor device according to claim 1, wherein the forming the low crystalline film comprises:

forming the low crystalline film from one of an amorphous semiconductor film, a polycrystalline semiconductor film, and a metal nitride film.

3. The method of manufacturing a semiconductor device according to claim 1, wherein the compound semiconductor layer is made of a group-III nitride.

4. The method of manufacturing a semiconductor device according to claim 1, wherein the substrate is made from a single crystal of silicon or silicon carbide.

5. The method of manufacturing a semiconductor device according to claim 1, further comprising:

removing the low crystalline film in the element forming area.

6. A method of manufacturing a semiconductor device, which comprises: a substrate; a compound semiconductor layer formed on the substrate; an element forming area provided in the compound semiconductor layer; and at least one semiconductor element, which includes a first main electrode and a second main electrode, wherein the at least one semiconductor element is formed in the element forming area, the method comprising:

forming a first compound growth layer, which includes the element forming area, on the substrate;

forming a second compound growth layer on the substrate to surround the element forming area when viewed from a plane, wherein the second compound growth layer has a crystallinity lower than a crystallinity of the first compound growth layer, wherein the forming the second compound growth layer further comprises forming a first area that is to be cut as a dicing area, and forming a second area that is located between the first area and the element forming area; and cutting the first area.

7. A semiconductor device comprising:

a substrate;

a compound semiconductor layer formed on the substrate;

an element forming area provided in the compound semiconductor layer; and at least one semiconductor element, which includes a first main electrode and a second main electrode, wherein the at least one semiconductor element is formed in the element forming area, wherein the compound semiconductor layer comprises:

a first compound growth layer, which is formed on the substrate and includes the element forming area; and a second compound growth layer formed on the substrate to surround the element forming area when viewed from a plane, wherein the second compound growth layer has a crystallinity lower than a crystallinity of the first compound growth layer, and wherein a low crystalline film is selectively formed between the substrate and the second compound growth layer to surround the element forming area when viewed from the plane.

8. The semiconductor device according to claim 7, wherein the low crystalline film is made of any one of an amorphous semiconductor film, a polycrystalline semiconductor film, and a metal nitride film.

9. The semiconductor device according to claim 7, wherein the compound semiconductor layer is made of a group-III nitride.

10. The semiconductor device according to claim 7, wherein the substrate is made from single crystal of silicon or silicon carbide.

11. The semiconductor device according to claim 7, wherein the first compound growth layer includes a buffer layer formed directly on the substrate, a carrier transit layer formed directly on the buffer layer, and a carrier supply layer formed directly on the carrier transit layer.

12. The semiconductor device according to claim 7, wherein the second compound growth layer includes a larger number of crystal defects than the first compound growth layer.

13. The semiconductor device according to claim 7, wherein the second compound growth layer comprises:

a first area, the first area being a predetermined dicing area that is cut when a wafer including the semiconductor device is divided; and a second area that is located between the first area and the element forming area.

14. The semiconductor device according to claim 13, wherein the first area has a predetermined width.

* * * * *